United States Patent
Baek et al.

(10) Patent No.: US 9,627,649 B2
(45) Date of Patent: Apr. 18, 2017

(54) ORGANIC LIGHT EMITTING DISPLAY DEVICE

(71) Applicant: LG DISPLAY CO., LTD., Seoul (KR)

(72) Inventors: Heume Il Baek, Goyang-si (KR); Ho Jin Ryu, Goyang-si (KR); Young Gu Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/553,753

(22) Filed: Nov. 25, 2014

(65) Prior Publication Data

US 2015/0144925 A1 May 28, 2015

(30) Foreign Application Priority Data

Nov. 26, 2013 (KR) .......................... 10-2013-0144371
Sep. 17, 2014 (KR) .......................... 10-2014-0123403

(51) Int. Cl.
*H01L 51/52* (2006.01)
*H01L 27/32* (2006.01)

(52) U.S. Cl.
CPC ........ *H01L 51/5265* (2013.01); *H01L 27/326* (2013.01); *H01L 27/3213* (2013.01); *H01L 51/5215* (2013.01); *H01L 2251/533* (2013.01)

(58) Field of Classification Search
None
See application file for complete search history.

(56) References Cited

U.S. PATENT DOCUMENTS

| 8,334,650 | B2 | 12/2012 | Jeong et al. | |
| 8,536,782 | B2 | 9/2013 | Lee et al. | |
| 2004/0233140 | A1* | 11/2004 | Jo | G09G 3/325 345/76 |
| 2006/0192220 | A1* | 8/2006 | Nishikawa | H01L 51/5265 257/98 |
| 2009/0200921 | A1* | 8/2009 | Lee | H01L 27/3211 313/504 |
| 2009/0261715 | A1* | 10/2009 | Sung | H01L 51/5265 313/504 |
| 2010/0219749 | A1* | 9/2010 | Moriyama | H01L 27/3244 313/504 |
| 2012/0001207 | A1* | 1/2012 | Lee | H01L 51/5265 257/89 |
| 2015/0332628 | A1* | 11/2015 | Ren | G09G 3/3258 345/690 |

FOREIGN PATENT DOCUMENTS

KR 10-2011-0064672 A 6/2011
KR 10-2011-0068638 A 6/2011

* cited by examiner

*Primary Examiner* — Charles Garber
*Assistant Examiner* — Alia Sabur
(74) *Attorney, Agent, or Firm* — Birch, Stewart, Kolasch & Birch, LLP

(57) ABSTRACT

Discussed is an organic light emitting display device. An OLED including a transparent anode formed of one conductive transparent material and an organic light emitting diode (OLED) including a cavity anode formed of a plurality of conductive materials are provided in one panel.

10 Claims, 11 Drawing Sheets

Bottom Emission Type (a)          (b)

| 11 | Cathode |
|---|---|
| | ETL |
| | EML |
| | HTL |
| | HIL |
| | ITO |
| | SiOx |
| | SiNx |
| | SiO2 |
| | Glass |

| | Cathode | 21 |
|---|---|---|
| | ETL | |
| | EML | |
| | HTL | |
| | HIL | |
| | ITO | |
| | Ag | |
| | ITO | |
| | SiOx | |
| | SiNx | |
| | SiO2 | |
| | Glass | |

(a)

(b)

(a)

(b)

ORGANIC LIGHT EMITTING DISPLAY DEVICE

CROSS-REFERENCE TO RELATED APPLICATIONS

This application claims the benefit of the Korean Patent Application No. 10-2013-0144371 filed on Nov. 26, 2013 and the Korean Patent Application No. 10-2014-0123403 filed on Sep. 17, 2014, which are hereby incorporated by reference as if fully set forth herein.

BACKGROUND OF THE INVENTION

Field of the Invention

The present invention relates to an organic light emitting display device, and more particularly, to an organic light emitting display device having a bottom emission structure.

Discussion of the Related Art

A flat panel display (FPD) device is applied to various electronic devices such as portable phones, tablet personal computers (PCs), notebook computers, monitors, etc. Examples of the FPD device include liquid crystal display (LCD) devices, plasma display panel (PDP) devices, organic light emitting display devices, etc. Recently, electrophoretic display (EPD) devices are being widely used as one type of the FPD device.

Among the display devices, the organic light emitting display devices use a self-emitting element, and thus have a fast response time, high emission efficiency, high luminance, and a broad viewing angle.

FIG. 1 is an exemplary diagram for describing a light output manner of a related art organic light emitting display device, and illustrates an organic light emitting display device having a bottom emission structure in which light is output to a lower substrate.

The organic light emitting display device may be configured in a top emission type where an organic light emitting diode (OLED) is formed on the lower substrate, and light emitted from the OLED is output to the outside through an upper substrate. However, as illustrated in FIG. 1, the organic light emitting display device may be configured in a bottom emission type where the OLED is formed on the lower substrate, and the light emitted from the OLED is output to the lower substrate.

In the organic light emitting display device having the bottom emission type, as illustrated in FIG. 1, an anode, an organic emission layer, and a cathode are formed on a transparent substrate, each of a plurality of pixels is divided by a bank, and the OLED emits light with a current which is transferred by a driving thin film transistor (TFT).

FIG. 2 is an exemplary diagram schematically illustrating a cross-sectional structure of an OLED applied to a related art organic light emitting display device, and FIG. 3 is a graph showing a viewing angle characteristic of the related art organic light emitting display device.

The related art organic light emitting display device having a bottom emission structure, as illustrated in FIG. 2(a), includes a plurality of pixels. An OLED 11 is formed in each of the plurality of pixels.

The OLED 11 may include a plurality of insulating layers such as $SiO_2$, SiNx, and SiOx stacked on a substrate, an anode formed of indium tin oxide (ITO), an organic emission layer which includes a hole injection layer (HIL), a hole transport layer (HTL), an emission material layer (EML), and an electron transport layer (ETL), and a cathode.

As seen in a graph illustrated as a non-cavity in FIG. 3(a), a general OLED has a good luminance viewing angle, and as seen in a graph illustrated as a non-cavity in FIG. 3(b), the general OLED has a good color difference characteristic. However, as illustrated in FIG. 2(a), the general OLED using ITO as an anode has a problem in which it is difficult to secure desired color coordinates by merely changing a general light emitting material. In particular, in the general OLED, it is difficult to secure a good deep blue characteristic.

Therefore, as illustrated in FIG. 2(b), in an OLED applied to another organic light emitting display device, an anode is formed in a three-layer structure including ITO/Ag/ITO. The OLED, having a structure which is as illustrated in FIG. 2(b), uses a micro-cavity. A method using the micro-cavity is disclosed in references such as Korean Patent Publication No. 10-2011-0068638 and Korean Patent Publication No. 10-2011-0064672.

In a related art OLED where an anode is formed in a three-layer structure, due to an effect of a micro-cavity which is formed between aluminum (Al) used as a cathode and the anode having the three-layer structure, an emission spectrum is narrowed, and thus, a more enhanced color characteristic is secured. However, in the related art OLED having the anode having the three-layer structure, as seen in a graph illustrated as a micro-cavity in FIG. 3A, a luminance viewing angle is narrowed, and as seen in a graph illustrated as a micro-cavity in FIG. 3B, a color difference characteristic is degraded. Therefore, is a display device which includes the OLED including the anode having the three-layer structure, it is difficult to secure a viewing angle characteristic suitable for the purpose of using the display device.

To provide an additional description, as shown in FIGS. 3(a) and 3(b), the OLED (illustrated as a micro-cavity) including the anode having the three-layer structure has a front luminance characteristic which is enhanced by 1.8 times in comparison with an OLED including an anode formed of only ITO. However, in the OLED including the anode having the three-layer structure, a luminance viewing angle characteristic and a color difference characteristic are greatly degraded.

In order to adjust the degradation in a luminance viewing angle characteristic and a color difference characteristic, a reflection characteristic and a transmission characteristic of an anode should be adjusted by adjusting a thickness of Al forming a cathode. However, generally, in a manufacturing process, an adjustment range is inevitably limited for securing processability. For this reason, it is not easy to adjust a thickness of Al and a reflection characteristic and a transmission characteristic of an anode in consideration of a viewing angle characteristic.

SUMMARY OF THE INVENTION

Accordingly, the present invention is directed to provide an organic light emitting display device that substantially obviates one or more problems due to limitations and disadvantages of the related art.

An aspect of the present invention is directed to provide an organic light emitting display device in which an OLED including a transparent anode formed of one conductive transparent material and an OLED including a cavity anode formed of a plurality of conductive materials are formed in one panel.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including: a panel in which a plurality of pixels are provided; and a panel driver configured to drive the panel, wherein, each of the plurality of pixels includes a plurality of sub-pixels, and a first organic light emitting diode (OLED) including a cavity anode formed of a plurality of conductive materials and a second OLED including a transparent anode formed of one conductive transparent material are provided in each of the plurality of sub-pixels.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 4:
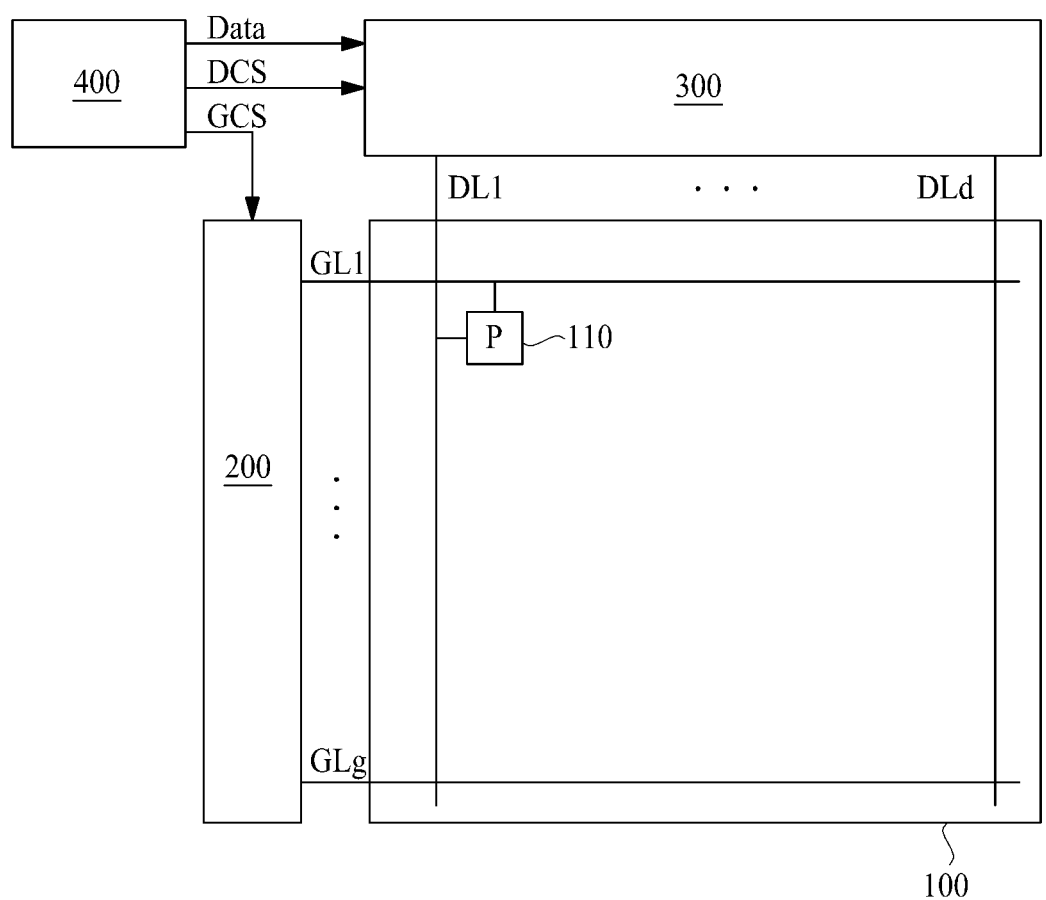
FIG. 4 is a diagram illustrating a configuration of an organic light emitting display device according to an embodiment of the present invention.

FIG. 4 is a diagram illustrating a configuration of an organic light emitting display device according to an embodiment of the present invention.

The organic light emitting display device according to an embodiment of the present invention, as illustrated in FIG. 4, includes a panel 100 in which a plurality of sub-pixels (P) 110 are respectively formed in a plurality of intersection areas between a plurality of gate lines GL1 to GLg and a plurality of data lines DL1 to DLd, a gate driver 200 that sequentially supplies a scan pulse to the gate lines GL1 to GLg which are formed in the panel 100, a data driver 300 that respectively supplies data voltages to the data lines DL1 to DLd which are formed in the panel 100, and a timing controller 400 that controls functions of the gate driver 200 and the data driver 300.

In the panel 100, the sup-pixels (P) 110 are respectively formed in a plurality of areas defined by intersections between the plurality of gate lines GL and the plurality of data lines DL.

Each of the sub-pixels 100 includes an organic light emitting diode (OLED), which emits light, and a driver that drives the OLED.

First, the OLED may be configured in a top emission type where light emitted from the OLED is output to the outside through an upper substrate, or may be configured in a bottom emission type where the light emitted from the OLED is output to a lower substrate.

The present invention relates to a display device including an OLED which is driven in the bottom emission type. In the OLED which is driven in the bottom emission type, an anode, an organic emission layer, and a cathode are formed on a transparent lower substrate, and each of the sub-pixels 110 is divided by a bank. The OLED emits light with a current which is transferred by a driving thin film transistor (TFT), and an upper end of the cathode is sealed by an upper substrate.

One OLED may be formed in the sub-pixel 110 (a first embodiment and a second embodiment), or two OLEDs may be formed in the sub-pixel 110 (a third embodiment).

Second, the driver may include at least two or more transistors, which are connected to the data line DL and the gate line GL and control driving of the OLED, and a storage capacitor.

The anode of the OLED is connected to a first power source, and the cathode is connected to a second power source. The OLED outputs light having certain luminance which corresponds to a current supplied from a driving transistor.

When the scan pulse is supplied to the gate line GL, the driver controls an amount of current supplied to the OLED according to a data voltage supplied to the data line DL.

To this end, the driving transistor is connected between the first power source and the OLED, and a switching transistor is connected between the driving transistor, the data line DL, and the gate line GL.

A structure of the sub-pixel 110, a structure of the OLED, and a structure of the driver will be described below in detail with reference to FIGS. 5 to 8.

The timing controller 400 outputs a gate control signal GCS for controlling the gate driver 200 and a data control signal DCS for controlling the data driver 300 by using a vertical sync signal, a horizontal sync signal, and a clock which are supplied from an external system (not shown).

The timing controller 400 samples input image data received from the external system, realigns the sampled image data, and supplies realigned digital image data to the data driver 300.

That is, the timing controller 400 realigns the input image data supplied from the external system, and supplies the realigned digital image data to the data driver 300. Also, the timing controller 400 generates the gate control signal GCS for controlling the gate driver 200 and the data control signal DCS for controlling the data driver 300 by using the vertical sync signal, the horizontal sync signal, and the clock which are supplied from the external system, and respectively transfers the gate control signal GCS and the data control signal DCS to the gate driver 200 and the data driver 300. Here, the vertical sync signal, the horizontal sync signal, and the clock are simply referred to as a timing signal.

To this end, particularly, the timing controller 400 includes: a receiver that receives the input image data and the signals from the external system; an image data processor that realigns the input image data received from the receiver so as to match the panel 100, and generates the realigned digital image data; a control signal generator that generates the gate control signal GCS for controlling the gate driver 200 and the data control signal DCS for controlling the data driver 300 by using the signals received from the receiver; and a transferor that respectively outputs the control signals, generated by the control signal generator, to the gate driver 200 and the data driver 300, and outputs the image data, generated by the image data processor, to the data driver 300.

The data driver 300 converts the image data, input from the timing controller 400, into analog data voltages, and respectively supplies data voltages of one horizontal line to the data lines at every one horizontal period where the scan pulse is supplied to a corresponding gate line. That is, the data driver 300 converts the image data into the data voltages by using gamma voltages supplied from a gamma voltage generator (not shown), and respectively outputs the data voltages to the data lines.

That is, the data driver 300 shifts a source start pulse SSP from the timing controller 400 according to a source shift clock SSC to generate a sampling signal. The data driver 300 latches the image data, input according to the source shift clock SSC, according to the sampling signal, and converts the image data into the data voltages. Then, the data driver 300 respectively supplies the data voltages to the data lines in units of a horizontal line in response to a source output enable signal SOE.

To this end, the data driver 300 may include a shift register, a latch, a digital-to-analog converter (DAC), and an output buffer.

The shift register outputs the sampling signal by using data control signals received from the timing controller 400.

The latch latches the digital image data which are sequentially received from the timing controller 400, and then simultaneously outputs the latched image data to the DAC.

The DAC converts the image data, transferred from the latch, into the data voltages, and outputs the data voltages. That is, the DAC converts the image data into the data voltages by using the gamma voltages supplied from the gamma voltage generator (not shown), and respectively outputs the data voltages to the data lines.

The output buffer respectively outputs the data voltages, transferred from the DAC, to the data lines DL of the panel 100 according to the source output enable signal SOE transferred from the timing controller 400.

The gate driver 200 sequentially supplies the scan pulse to the gate lines GL1 to GLg of the panel 100 in response to the gate control signal input from the timing controller 400. Therefore, a plurality of switching transistors which are respectively formed in a plurality of sub-pixels 110 on a corresponding horizontal line to which the scan pulse is applied are turned on, and an image may be output to each of the sub-pixels 110.

That is, the gate driver 200 shifts a gate start pulse GSP transferred from the timing controller 400 according to a gate shift clock GSC to sequentially supply the scan pulse having a gate-on voltage to the gate lines GL1 to GLg. Also, during the other period where the scan pulse is not supplied, the gate driver 200 supplies a gate-off voltage to the gate lines GL1 to GLg.

The gate driver 200 may be provided independently from the panel 100, and may be configured in a type which is electrically connected to the panel 100 by various manners. However, the gate driver 200 may be configured in a gate-in panel (GIP) type which is equipped in the panel 100. In this case, a gate control signal for controlling the gate driver 200 may include a start signal VST and a gate clock GCLK.

Moreover, hereinabove, it has been described that the data driver 300, the gate driver 200, and the timing controller 400 are separately provided, but at least one selected from the data driver 300 and the gate driver 200 may be provided as one body with the timing controller 400. Hereinafter, also, a generic name for the gate driver 200, the data driver 300, and the timing controller 400 is referred to as a panel driver.

Figure 5:
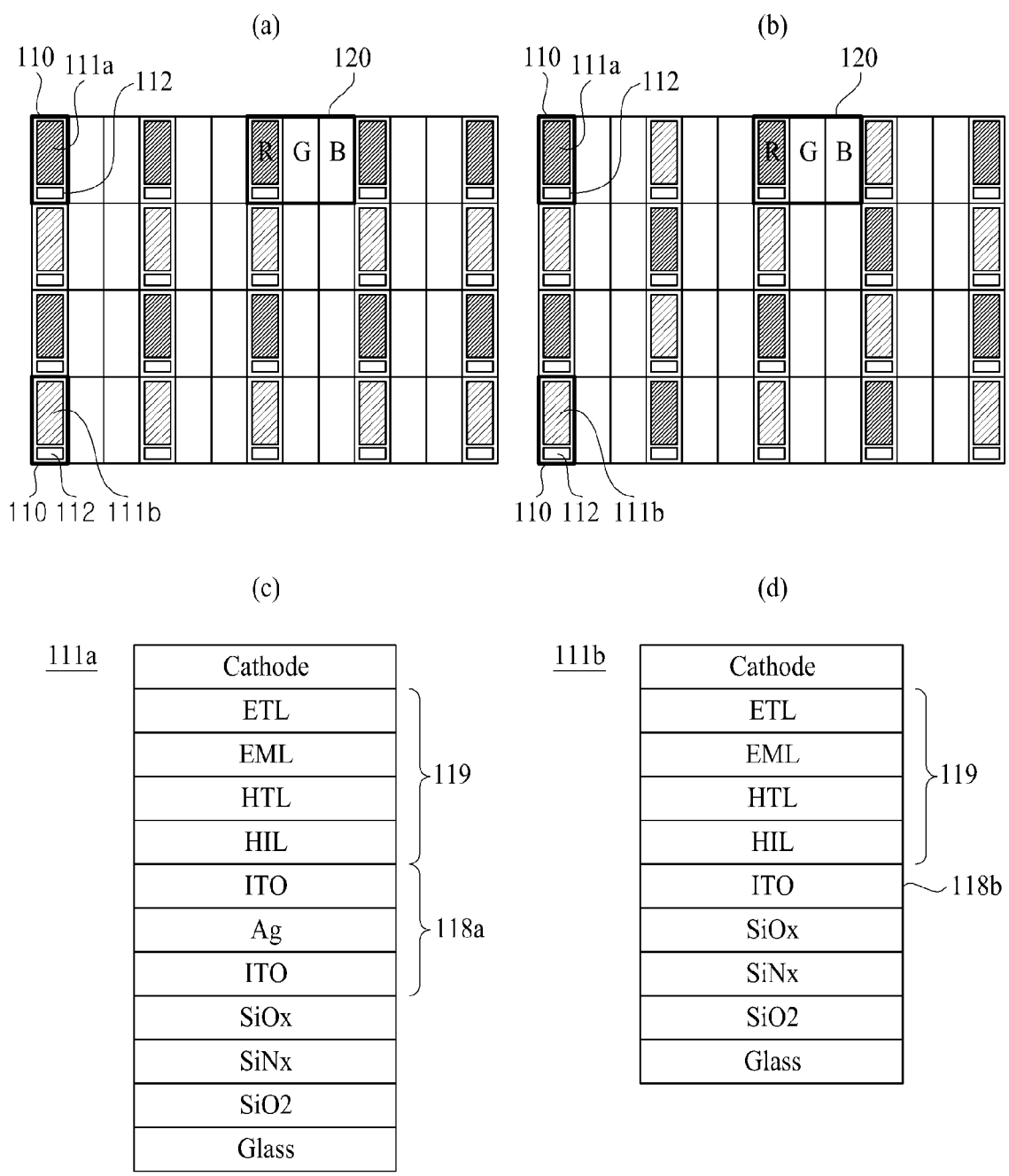
FIG. 5 is an exemplary diagram illustrating a panel applied to an organic light emitting display device according to first and second embodiments of the present invention.
Figure 6:
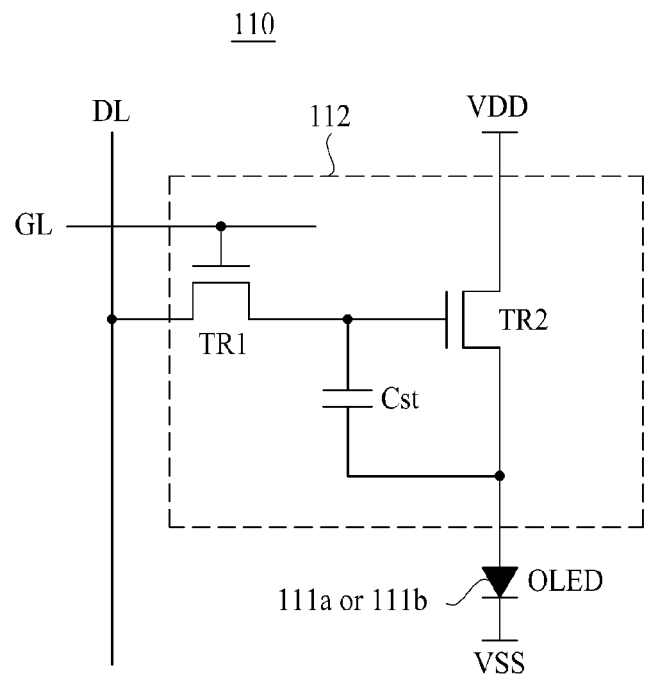
FIG. 6 is an exemplary diagram illustrating a driver provided in the panel applied to the organic light emitting display device according to the first and second embodiments of the present invention.
Figure 7:
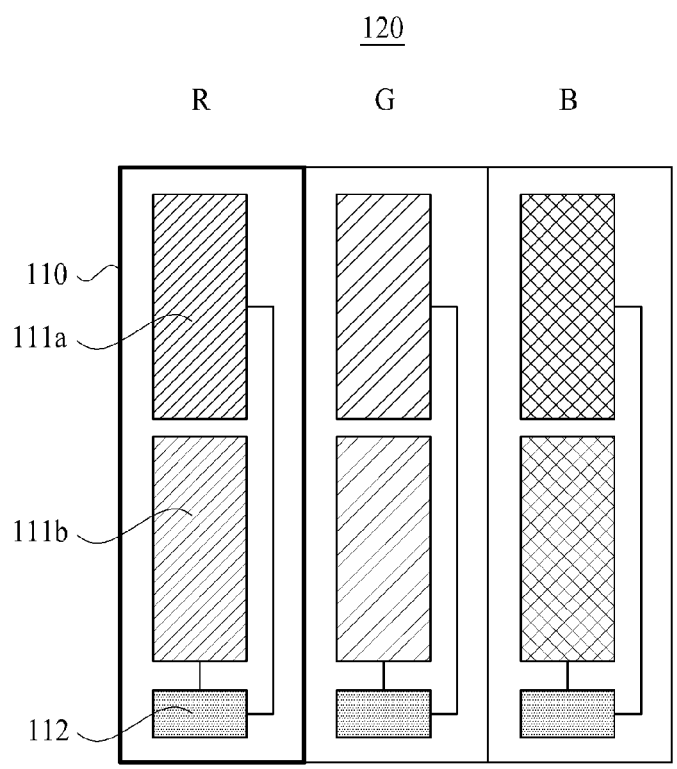
FIG. 7 is an exemplary diagram illustrating a panel applied to an organic light emitting display device according to a third embodiment of the present invention.
Figure 8:
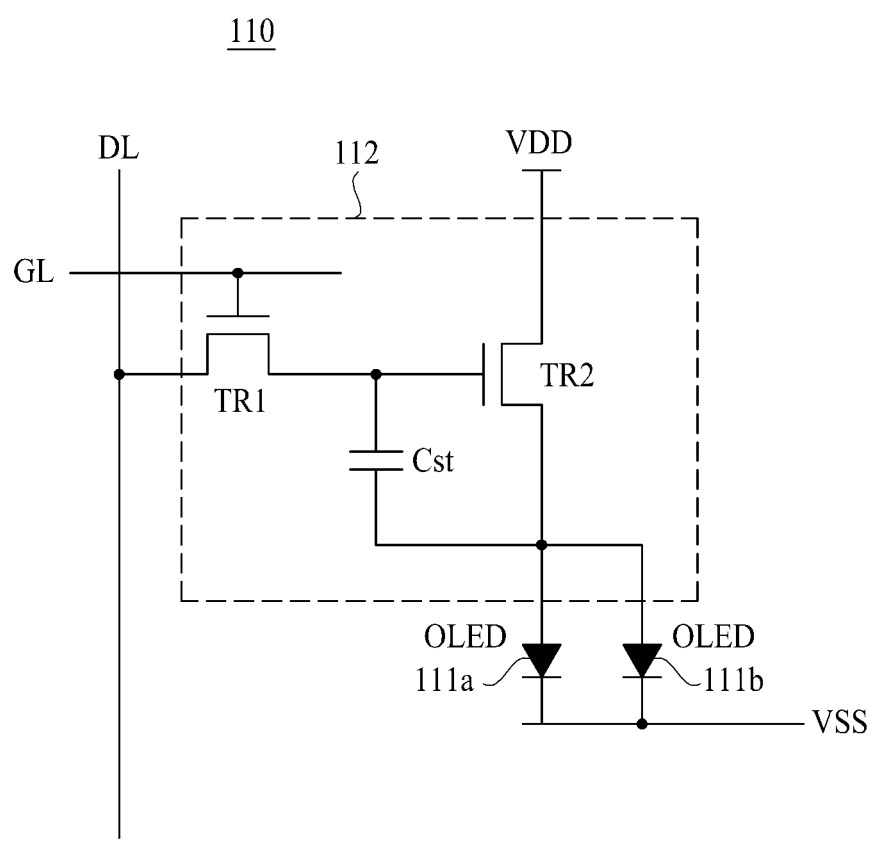
FIG. 8 is an exemplary diagram illustrating a driver provided in the panel applied to the organic light emitting display device according to the third embodiment of the present invention.

FIG. 5 is an exemplary diagram illustrating a panel applied to an organic light emitting display device according to first and second embodiments of the present invention. FIG. 5(a) is an exemplary diagram illustrating a panel applied to an organic light emitting display device according to a first embodiment of the present invention. FIG. 5(b) is an exemplary diagram illustrating a panel applied to an organic light emitting display device according to a second embodiment of the present invention. FIG. 5(c) is an exemplary diagram illustrating a cross-sectional structure of a first OLED 111a having a cavity anode 118a applied to the organic light emitting display device according to the first and second embodiments of the present invention. FIG. 5(d) is an exemplary diagram illustrating a cross-sectional structure of a second OLED 111b having a transparent anode 118b applied to the organic light emitting display device according to the first and second embodiments of the present invention. FIG. 6 is an exemplary diagram illustrating a driver provided in the panel applied to the organic light emitting display device according to the first and second embodiments of the present invention. FIG. 7 is an exemplary diagram illustrating a panel applied to an organic light emitting display device according to a third embodiment of the present invention. FIG. 8 is an exemplary diagram illustrating a driver provided in the panel applied to the organic light emitting display device according to the third embodiment of the present invention;

First, the organic light emitting display device according to the first embodiment of the present invention will be described below.

The organic light emitting display device according to the first embodiment of the present invention, as illustrated in FIGS. 4 and 5(a), includes: a panel 100 in which a plurality of first sub-pixels 110 including the first OLED 111a having the cavity anode 118a formed of a plurality of conductive materials are formed on an nth horizontal line, and a plurality of second sub-pixels 110 including the second OLED 111b having the transparent anode 118b formed of one conductive material are formed on an n+1st horizontal line; and a panel driver 200, 300 and 400 that drives the panel 100. The panel driver 200, 300 and 400 has been described above, and thus, a structure and a function of the panel 100 will be described below in detail.

As illustrated in FIG. 5(a), a plurality of sub-pixels are formed along a horizontal line in the panel 100. The sub-pixels include a red sub-pixel R, a green sub-pixel G, and a blue sub-pixel B. The red sub-pixel R, the green sub-pixel G, and the blue sub-pixel B configure one unit pixel 120. The unit pixel 120 may emit white light.

The red sub-pixel R, the green sub-pixel G, and the blue sub-pixel B are sequentially, repeatedly arranged on one horizontal line.

The first sub-pixels 110 including the first OLED 111a having the cavity anode 118a formed of a plurality of conductive materials are formed on the nth horizontal line among a plurality horizontal lines of the panel 100, and the second sub-pixels 110 including the second OLED 111b having the transparent anode 118b formed of one conductive material are formed on the n+1st horizontal line.

For example, when n is an odd number, namely, in FIG. 5(a), the first sub-pixels 110 including the first OLED 111a having the cavity anode 118a are formed on odd-numbered horizontal line. To provide a more detailed description, in FIG. 5(a), the first sub-pixels 110 including the first OLED 111a having the cavity anode 118a are formed on a first horizontal line and a third horizontal line.

In the example, the second sub-pixels 110 including the second OLED 111b having the transparent anode 118b are formed on even-numbered horizontal line. To provide a more detailed description, in FIG. 5(a), the second sub-pixels 110 including the second OLED 111b having the transparent anode 118b are formed on a second horizontal line and a fourth horizontal line.

In the panel 100 applied to the organic light emitting display device according to the first embodiment of the present invention, the first sub-pixels including the first OLED 111a and the second sub-pixels including the second OLED 111b are repeatedly formed on each horizontal line.

Therefore, in FIG. 5(a), only the first sub-pixels of red (R) and the second sub-pixels of red (R) are illustrated, but the present embodiment is not limited thereto. The first sub-pixels of green (G) and the second sub-pixels of green (G) are formed on each horizontal line, and the first sub-pixels of blue (B) and the second sub-pixels of blue (B) are formed on each horizontal line.

The first OLED 111a including the cavity anode 118a, as illustrated in FIG. 5(c), includes a lower transparent substrate, a plurality of insulating layers ($SiO_2$, SiNx, and SiOx) stacked on the lower transparent substrate, the cavity anode 118a formed of a plurality of conductive materials, an organic emission part 119 stacked on the cavity anode 118a, and a cathode stacked on the organic emission part 119.

The lower transparent substrate may be formed of a transparent glass substrate, or may be formed of a transparent synthetic resin substrate or a transparent synthetic resin film.

The plurality of insulating layers ($SiO_2$, SiNx, and SiOx) insulate various electrodes which are formed in a driver 112.

For example, as illustrated in FIG. 6, the driver 112 includes a switching transistor TR1, a driving transistor TR2, and a capacitor Cst. The plurality of insulating layers insulate a gate, a source, and a drain of each of the transistors.

The plurality of insulating layers may be formed of various materials in addition to the above-described materials. Also, in FIG. 5(c), the plurality of insulating layers are illustrated as three layers, but the number of the insulating layers may be variously formed.

The cavity anode 118a may be formed of two conductive transparent materials and a transparent metal thin layer which is inserted between the two conductive transparent materials.

For example, each of the two conductive transparent materials may be ITO, and the transparent metal thin layer may be formed of an Al thin layer. The transparent metal thin layer is formed of Al, but when the Al thin layer is formed to a thickness of 20 nm or less, the transparent metal thin layer has a transmittance of 50% to 70%. Therefore, the transparent metal thin layer is formed of a thin layer to have a light transmittance of 50% to 70%.

The organic emission part 119 may include a hole transport layer (HTL), an emission material layer (EML), and an electron transport layer (ETL).

In order to enhance an emission efficiency of the organic emission part 119, a hole injection layer (HIL) may be formed between the cavity anode 118a and the HTL, and an electron injection layer (EIL) may be formed between the cathode and the ETL.

The cathode performs a function of a reflective plate so that light emitted from the organic emission part 119 is output to the outside through the cavity anode 118a. In this case, the cathode may be formed of metal such as Al, tantalum (Ta), or silver (Ag).

An upper substrate (not shown) for sealing the cavity anode 118a may be coupled to an upper end of the cavity anode 118a.

The first OLED 111a is formed in a bottom emission type where light is output to the outside through the cavity anode 118a.

In the first OLED 111a, when a positive (+) voltage and a negative (−) voltage are respectively applied to the cavity anode 118a and the cathode, a positive hole of the cavity anode 118a and an electron of the cathode are transported to the EML, and an exciton is generated. When the exciton is shifted from an excited state to a ground state, light is emitted, and the light is output as visible light through the EML.

A micro-cavity phenomenon occurs between the cavity anode 118a formed of three conductive materials and the cathode.

The micro-cavity phenomenon denotes a phenomenon in which as light reflected between a mirror and a mirror is counteracted or constructive interference for the light occurs, only light of a certain wavelength is maintained, and the other wavelength is counteracted, whereby an intensity of the light is weakened. A specific wavelength increases due to the micro-cavity phenomenon.

That is, the first OLED 111a increases emission efficiency by using a micro-cavity.

The second OLED 111b including the transparent anode 118b, as illustrated in FIG. 5(d), includes a lower transparent substrate, a plurality of insulating layers ($SiO_2$, SiNx, and SiOx) stacked on the lower transparent substrate, the transparent anode 118b formed of one conductive material, an organic emission part 119 stacked on the transparent anode 118b, and a cathode stacked on the organic emission part 119.

The lower transparent substrate may be formed of a transparent glass substrate, or may be formed of a transparent synthetic resin substrate or a transparent synthetic resin film.

The plurality of insulating layers ($SiO_2$, SiNx, and SiOx), as described above, insulate various electrodes which are formed in a driver 112.

For example, as illustrated in FIG. 6, the driver 112 includes a switching transistor TR1, a driving transistor TR2, and a capacitor Cst. The plurality of insulating layers insulate a gate, a source, and a drain of each of the transistors.

The plurality of insulating layers may be formed of various materials in addition to the above-described materials. Also, in FIG. 5(d), the plurality of insulating layers are illustrated as three layers, but the number of the insulating layers may be variously formed.

The transparent anode 118b is formed of one conductive transparent material. For example, the transparent anode 118b may be formed of ITO.

Since the transparent anode 118b is formed of a transparent electrode such as ITO, light emitted from the organic emission part 119 may be transmitted toward the lower substrate.

The organic emission part 119 may include a hole transport layer (HTL), an emission material layer (EML), and an electron transport layer (ETL).

In order to enhance an emission efficiency of the organic emission part 119, a hole injection layer (HIL) may be formed between the transparent anode 118b and the HTL, and an electron injection layer (EIL) may be formed between the cathode and the ETL.

The cathode performs a function of a reflective plate so that light emitted from the organic emission part 119 is output to the outside through the transparent anode 118b. In this case, the cathode may be formed of metal such as Al, tantalum (Ta), or silver (Ag).

An upper substrate for sealing the second OLED 111b may be coupled to an upper end of the cathode.

The second OLED 111b is formed in a bottom emission type where light is output to the outside through the transparent anode 118b.

In the second OLED 111b, when a positive (+) voltage and a negative (−) voltage are respectively applied to the transparent anode 118b and the cathode, a positive hole of the transparent anode 118b and an electron of the cathode are transported to the EML, and an exciton is generated. When the exciton is shifted from an excited state to a ground state, light is emitted, and the light is output as visible light through the EML.

The micro-cavity phenomenon does not occur between the transparent anode 118b and the cathode.

As illustrated in FIG. 6, the driver 112 for emitting light from the first OLED 111a or the second OLED 111b is provided in each of the sub-pixels 110 which are formed in the panel 100.

The driver 112 includes: a driving transistor TR2 that is connected between a high-level voltage VDD terminal and a low-level voltage VSS terminal, and drives the first OLED 111a or the second OLED 111b; a switching transistor TF1 that is connected between the driving transistor TR2 and the data line DL, and is turned on by the scan pulse supplied through the gate line GL; and a capacitor Cst that is connected to the first OLED 111a or the second OLED 111b and a node between the switching transistor TR1 and the driving transistor TR2.

The driver 112 may further include a plurality of transistors for compensating for a deterioration of the first OLED 111a or the second OLED 111b or sensing deterioration information.

A detailed configuration and function of the driver 112 are the same as a detailed configuration and function of a driver which is provided in each pixel of an organic light emitting display device which is generally used at present, and thus, their detailed descriptions are not provided.

The first sub-pixel 110 includes the first OLED 111a and the driver 112, and the second sub-pixel 110 includes the second OLED 111b and the driver 112.

Since the first OLED 111a or the second OLED 111b is driven in the bottom emission type, as illustrated in FIG. 5, the driver 112 is disposed in parallel with the first OLED 111a or the second OLED 111b in the first sub-pixel or the second sub-pixel.

Second, the organic light emitting display device according to the second embodiment of the present invention will now be described.

The organic light emitting display device according to the second embodiment of the present invention, as illustrated in FIGS. 4 and 5(b), includes: a panel 100 in which a plurality of first sub-pixels 110 including the first OLED 111a having the cavity anode 118a formed of a plurality of conductive materials and a plurality of second sub-pixels 110 including the second OLED 111b having the transparent anode 118b formed of one conductive material are formed on one horizontal line; and a panel driver 200, 300 and 400 that drives the panel 100. The panel driver 200, 300 and 400 has been described above, and thus, a structure and a function of the panel 100 will be described below in detail. Also, details which are the same as and similar to those of the panel 100 described in the first embodiment are not described or will be briefly described.

As illustrated in FIG. 5(b), a plurality of sub-pixels are formed along a horizontal line in the panel 100. The sub-pixels include a red sub-pixel R, a green sub-pixel G, and a blue sub-pixel B. The red sub-pixel R, the green sub-pixel G, and the blue sub-pixel B configure one unit pixel 120.

The red sub-pixel R, the green sub-pixel G, and the blue sub-pixel B are sequentially, repeatedly arranged on one horizontal line.

The first sub-pixels 110 including the first OLED 111a having the cavity anode 118a formed of a plurality of conductive materials and the second sub-pixels 110 including the second OLED 111b having the transparent anode 118b formed of one conductive material are formed on each of a plurality of horizontal lines of the panel 100.

For example, in FIG. 5(b), a red sub-pixel R of a first unit pixel 120 which is formed at the left of a first horizontal line is the first sub-pixel including the first OLED 111a, and a red sub-pixel R of a second unit pixel 120 is the second sub-pixel including the second OLED 111b.

In the panel 100 applied to the organic light emitting display device according to the second embodiment of the present invention, the first sub-pixels including the first OLED 111a and the second sub-pixels including the second OLED 111b are repeatedly formed on one horizontal line.

Therefore, in FIG. 5(b), only the first sub-pixels of red (R) and the second sub-pixels of red (R) are illustrated, but the present embodiment is not limited thereto. The first sub-pixels of green (G) and the second sub-pixels of green (G) are formed on one horizontal line, and the first sub-pixels of blue (B) and the second sub-pixels of blue (B) are formed on one horizontal line.

In this case, the red sub-pixel R, the green sub-pixel G, and the blue sub-pixel B which configure one unit pixel 120 may be the first sub-pixels. Also, the red sub-pixel R, the green sub-pixel G, and the blue sub-pixel B which configure another unit pixel 120 adjacent to the one unit pixel 120 including the first sub-pixels may be the second sub-pixels.

However, the first sub-pixel and the second sub-pixel may be included in the one unit pixel 120. For example, in the one unit pixel 120, the red sub-pixel may be the first sub-pixel including the first OLED 111a, and the green sub-pixel and the blue sub-pixel may be the second sub-pixels including the second OLED 111b.

The first OLED 111a including the cavity anode 118a, as illustrated in FIG. 5(c), includes a lower transparent substrate, a plurality of insulating layers (SiO₂, SiNx, and SiOx) stacked on the lower transparent substrate, the cavity anode 118a formed of a plurality of conductive materials, an organic emission part 119 stacked on the cavity anode 118a, and a cathode stacked on the organic emission part 119.

The lower transparent substrate may be formed of a transparent glass substrate, or may be formed of a transparent synthetic resin substrate or a transparent synthetic resin film.

The plurality of insulating layers (SiO₂, SiNx, and SiOx) insulate various electrodes which are formed in a driver 112.

The cavity anode 118a may be formed of two conductive transparent materials and a transparent metal thin layer which is inserted between the two conductive transparent materials. For example, each of the two conductive transparent materials may be ITO, and the transparent metal thin layer may be formed of an Al thin layer. The transparent metal thin layer is formed of Al, but when the Al thin layer is formed to a thickness of 20 nm or less, the transparent metal thin layer has a transmittance of 50% to 70%. Therefore, the transparent metal thin layer is formed of a thin layer to have a light transmittance of 50% to 70%.

The organic emission part 119 may include a hole transport layer (HTL), an emission material layer (EML), and an electron transport layer (ETL). In order to enhance an emission efficiency of the organic emission part 119, a hole injection layer (HIL) may be formed between the cavity anode 118a and the HTL, and an electron injection layer (EIL) may be formed between the cathode and the ETL.

The cathode performs a function of a reflective plate so that light emitted from the organic emission part 119 is output to the outside through the cavity anode 118a. In this case, the cathode may be formed of metal such as Al, tantalum (Ta), or silver (Ag). An upper substrate (not shown) for sealing the first OLED 111a may be coupled to an upper end of the cavity anode 118a.

The first OLED 111a is formed in a bottom emission type where light is output to the outside through the cavity anode 118a. In the first OLED 111a, when a positive (+) voltage and a negative (−) voltage are respectively applied to the cavity anode 118a and the cathode, a positive hole of the cavity anode 118a and an electron of the cathode are transported to the EML, and an exciton is generated. When the exciton is shifted from an excited state to a ground state, light is emitted, and the light is output as visible light through the EML.

A micro-cavity phenomenon occurs between the cavity anode 118a formed of three conductive materials and the cathode. The micro-cavity phenomenon denotes a phenomenon in which as light reflected between a mirror and a mirror is counteracted or constructive interference for the light occurs, only light of a certain wavelength is maintained, and the other wavelength is counteracted, whereby an intensity of the light is weakened. A specific wavelength increases due to the micro-cavity phenomenon. That is, the first OLED 111a increases emission efficiency by using a micro-cavity.

The second OLED 111b including the transparent anode 118b, as illustrated in FIG. 5(d), includes a lower transparent substrate, a plurality of insulating layers (SiO₂, SiNx, and SiOx) stacked on the lower transparent substrate, the transparent anode 118b formed of one conductive material, an organic emission part 119 stacked on the transparent anode 118b, and a cathode stacked on the organic emission part 119.

The lower transparent substrate may be formed of a transparent glass substrate, or may be formed of a transparent synthetic resin substrate or a transparent synthetic resin film.

The plurality of insulating layers (SiO₂, SiNx, and SiOx), as described above, insulate various electrodes which are formed in a driver 112.

The transparent anode 118b is formed of one conductive transparent material. For example, the transparent anode 118b may be formed of ITO.

The organic emission part 119 may include a hole transport layer (HTL), an emission material layer (EML), and an electron transport layer (ETL). In order to enhance an emission efficiency of the organic emission part 119, a hole injection layer (HIL) may be formed between the transparent anode 118b and the HTL, and an electron injection layer (EIL) may be formed between the cathode and the ETL.

The cathode performs a function of a reflective plate so that light emitted from the organic emission part 119 is output to the outside through the transparent anode 118b. In this case, the cathode may be formed of metal such as Al, tantalum (Ta), or silver (Ag). An upper substrate (not shown) for sealing the second OLED 111b may be coupled to an upper end of the cathode.

The second OLED 111b is formed in a bottom emission type where light is output to the outside through the transparent anode 118b. The micro-cavity phenomenon does not occur between the transparent anode 118b and the cathode.

As illustrated in FIG. 6, the driver 112 for emitting light from the first OLED 111a or the second OLED 111b is provided in each of the sub-pixels 110 which are formed in the panel 100.

The driver 112 includes: a driving transistor TR2 that is connected between a high-level voltage VDD terminal and a low-level voltage VSS terminal, and drives the first OLED 111a or the second OLED 111b; a switching transistor TF1 that is connected between the driving transistor TR2 and the data line DL, and is turned on by the scan pulse supplied through the gate line GL; and a capacitor Cst that is connected to the first OLED 111a or the second OLED 111b and a node between the switching transistor TR1 and the driving transistor TR2.

A detailed configuration and function of the driver 112 are the same as a detailed configuration and function of a driver which is provided in each pixel of an organic light emitting display device which is generally used at present, and thus, their detailed descriptions are not provided.

The first sub-pixel 110 includes the first OLED 111a and the driver 112, and the second sub-pixel 110 includes the second OLED 111b and the driver 112. Since the first OLED 111a or the second OLED 111b is driven in the bottom emission type, as illustrated in FIG. 5, the driver 112 is disposed in parallel with the first OLED 111a or the second OLED 111b in the first sub-pixel or the second sub-pixel.

Third, the organic light emitting display device according to the third embodiment of the present invention will now be described.

The organic light emitting display device according to the third embodiment of the present invention, as illustrated in FIGS. 4 and 7, includes a panel 100 in which a plurality of unit pixels 120 are formed and a panel driver 200, 300 and 400 that drives the panel 100. Each of the plurality of unit pixels 110 includes a plurality of sub-pixels 110.

Each of the sub-pixels 110 includes the first OLED 111a having the cavity anode 118a formed of a plurality of conductive materials and the second OLED 111b having the transparent anode 118b formed of one conductive material. The panel driver 200, 300 and 400 has been described above, and thus, a structure and a function of the panel 100 will be described below in detail. Also, details which are the same as and similar to those of the panel 100 described in the first embodiment are not described or will be briefly described.

A plurality of sub-pixels are formed along a horizontal line in the panel 100. The sub-pixels include a red sub-pixel R, a green sub-pixel G, and a blue sub-pixel B. The red sub-pixel R, the green sub-pixel G, and the blue sub-pixel B configure one unit pixel 120. In FIG. 7, only one unit pixel 120 is illustrated, but the present embodiment is not limited thereto. The unit pixel 120 is provided in plurality along the horizontal line of the panel 100, and is also provided in plurality along a vertical line of the panel 100.

The red sub-pixel R, the green sub-pixel G, and the blue sub-pixel B are sequentially, repeatedly arranged on one horizontal line.

The first OLED 111a having the cavity anode 118a formed of a plurality of conductive materials and the second OLED 111b having the transparent anode 118b formed of one conductive material are formed in each of the sub-pixels 110 configuring the panel 100.

In the first and second embodiments of the present invention, the first OLED 111a and the second OLED 111b are formed in different sub-pixels 110.

However in the third embodiment of the present invention, the first OLED 111a and the second OLED 111b are formed in one sub-pixel 110.

For example, a red sub-pixel R, a green sub-pixel G, and a blue sub-pixel B are formed in one unit pixel 120 illustrated in FIG. 7, and the first OLED 111a and the second OLED 111b are formed in each of the red sub-pixel R, the green sub-pixel G, and the blue sub-pixel B.

The first OLED 111a and the second OLED 111b, which are formed in one sub-pixel 110, may have the same area or different areas.

The first OLED 111a which is formed in one sub-pixel 110 and includes the cavity anode 118a, as illustrated in FIG. 5(c), includes a lower transparent substrate, a plurality of insulating layers ($SiO_2$, SiNx, and SiOx) stacked on the lower transparent substrate, the cavity anode 118a formed of a plurality of conductive materials, an organic emission part 119 stacked on the cavity anode 118a, and a cathode stacked on the organic emission part 119.

The lower transparent substrate may be formed of a transparent glass substrate, or may be formed of a transparent synthetic resin substrate or a transparent synthetic resin film.

The plurality of insulating layers ($SiO_2$, SiNx, and SiOx) insulate various electrodes which are formed in a driver 112.

The cavity anode 118a may be formed of two conductive transparent materials and a transparent metal thin layer which is inserted between the two conductive transparent materials. For example, each of the two conductive transparent materials may be ITO, and the transparent metal thin layer may be formed of an Al thin layer. The transparent metal thin layer is formed of Al, but when the Al thin layer is formed to a thickness of 20 nm or less, the transparent metal thin layer has a transmittance of 50% to 70%. Therefore, the transparent metal thin layer is formed of a thin layer to have a light transmittance of 50% to 70%.

The organic emission part 119 may include a hole transport layer (HTL), an emission material layer (EML), and an electron transport layer (ETL). In order to enhance an emission efficiency of the organic emission part 119, a hole injection layer (HIL) may be formed between the cavity anode 118a and the HTL, and an electron injection layer (EIL) may be formed between the cathode and the ETL.

The cathode performs a function of a reflective plate so that light emitted from the organic emission part 119 is output to the outside through the cavity anode 118a. In this case, the cathode may be formed of metal such as Al, tantalum (Ta), or silver (Ag). An upper substrate (not shown) for sealing the cavity anode 118a may be coupled to an upper end of the cavity anode 118a.

The first OLED 111a is formed in a bottom emission type where light is output to the outside through the cavity anode 118a. In the first OLED 111a, when a positive (+) voltage and a negative (−) voltage are respectively applied to the cavity anode 118a and the cathode, a positive hole of the cavity anode 118a and an electron of the cathode are transported to the EML, and an exciton is generated. When the exciton is shifted from an excited state to a ground state, light is emitted, and the light is output as visible light through the EML.

A micro-cavity phenomenon occurs between the cavity anode 118a formed of three conductive materials and the cathode. The micro-cavity phenomenon denotes a phenomenon in which as light reflected between a mirror and a mirror is counteracted or constructive interference for the light occurs, only light of a certain wavelength is maintained, and the other wavelength is counteracted, whereby an intensity of the light is weakened. A specific wavelength increases due to the micro-cavity phenomenon. That is, the first OLED 111a increases emission efficiency by using a micro-cavity.

The second OLED 111b including the transparent anode 118b, as illustrated in FIG. 5(d), includes a lower transparent substrate, a plurality of insulating layers ($SiO_2$, SiNx, and SiOx) stacked on the lower transparent substrate, the transparent anode 118b formed of one conductive material, an organic emission part 119 stacked on the transparent anode 118b, and a cathode stacked on the organic emission part 119.

As illustrated in FIG. 8, the driver 112 for emitting light from the first OLED 111a or the second OLED 111b is provided in each of the sub-pixels 110 which are formed in the panel 100.

The driver 112 includes: a driving transistor TR2 that is connected between a high-level voltage VDD terminal and a low-level voltage VSS terminal, and drives the first OLED 111a and the second OLED 111b; a switching transistor TF1 that is connected between the driving transistor TR2 and the data line DL, and is turned on by the scan pulse supplied through the gate line GL; and a capacitor Cst that is connected to the first OLED 111a or the second OLED 111b and a node between the switching transistor TR1 and the driving transistor TR2.

The driver 112 may further include a plurality of transistors for compensating for a deterioration of the first OLED 111a or the second OLED 111b or sensing deterioration information.

The first OLED 111a and the second OLED 111b are connected between a high-level voltage line, through which the high-level voltage VDD is supplied, and a low-level voltage line through which the low-level voltage VSS is supplied. The first OLED 111a and the second OLED 111b simultaneously emit light due to the driving transistor TR2, and are simultaneously turned off.

For example, the first OLED 111a and the second OLED 111b are connected between the high-level voltage line and the low-level voltage line, and the driving transistor TR2 is connected between the first OLED 111a, the second OLED 111b, and the high-level voltage line. The cavity anode 118a of the first OLED 111a and the transparent anode 118b of the second OLED 111b are connected to the driving transistor TR2, and the cathode of the first OLED 111a and the cathode of the second OLED 111b are connected to the low-level voltage line. In this case, when the driving transistor TR2 is turned on and thus a current flows from the high-level voltage line to the low-level voltage line, the first OLED 111a and the second OLED 111b may emit light.

To provide an additional description, the first OLED 111a and the second OLED 111b are simultaneously driven by the driver 112 which is provided in the sub-pixel 110. To this end, the cavity anode 118a and the transparent anode 118b are connected in common to the driver 120 which is provided in the sub-pixel 110.

Since the first OLED 111a and the second OLED 111b is driven in the bottom emission type, as illustrated in FIG. 8, the driver 112 is disposed in parallel with the first OLED 111a and the second OLED 111b in the sub-pixel 110.

Figure 9:
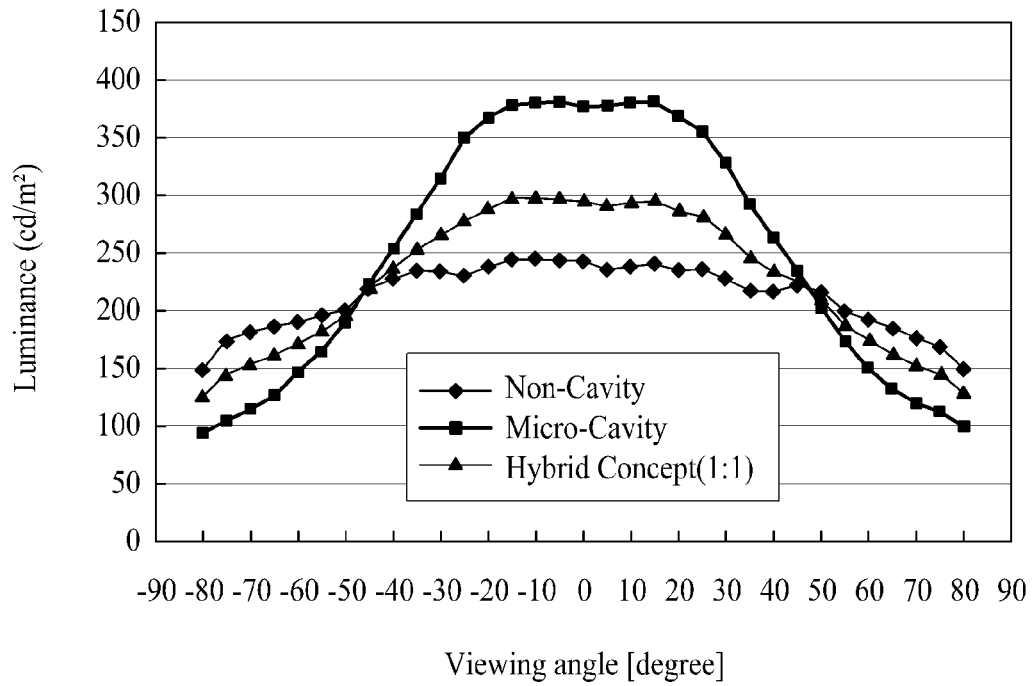
FIG. 9 is a graph showing a viewing angle characteristic of an organic light emitting display device according to an embodiment of the present invention.
Figure 9:
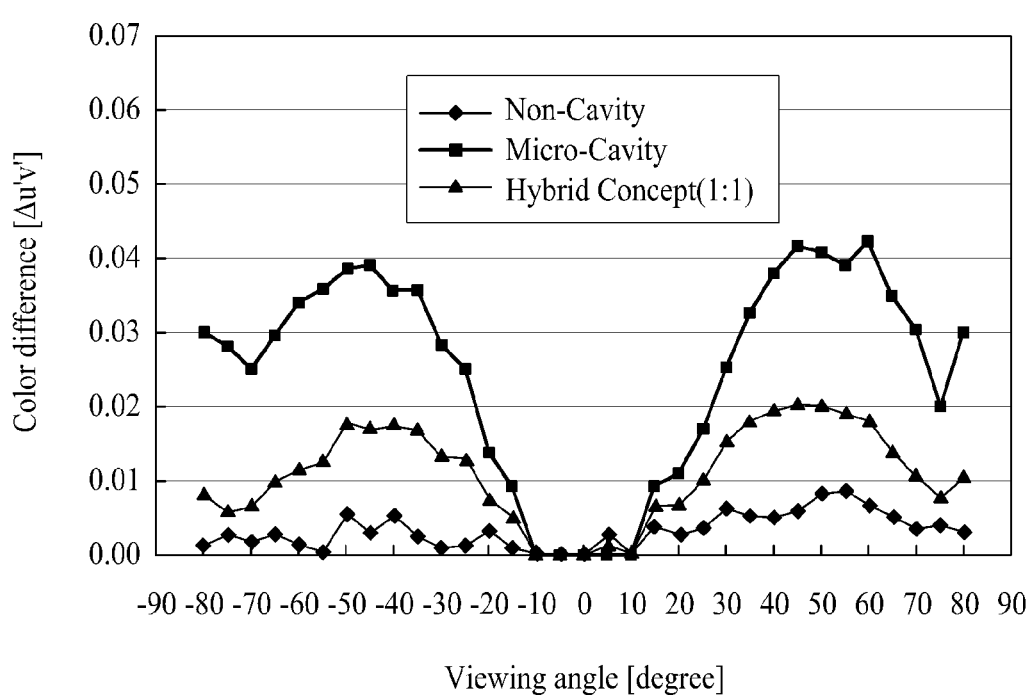

FIG. 9 is a graph showing a viewing angle characteristic of an organic light emitting display device according to an embodiment of the present invention.

The first OLED 111a including the cavity anode 118a and the second OLED including the transparent anode 118b are formed in the panel 100 applied to the organic light emitting display device according to the embodiments of the present invention.

Figure 1:
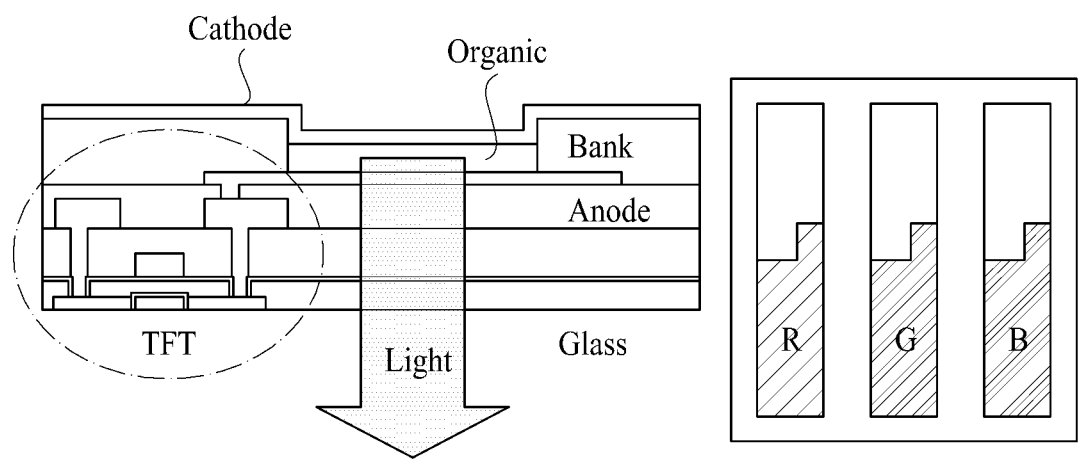
FIG. 1 is an exemplary diagram for describing a light output manner of a related art organic light emitting display device.
Figure 2:
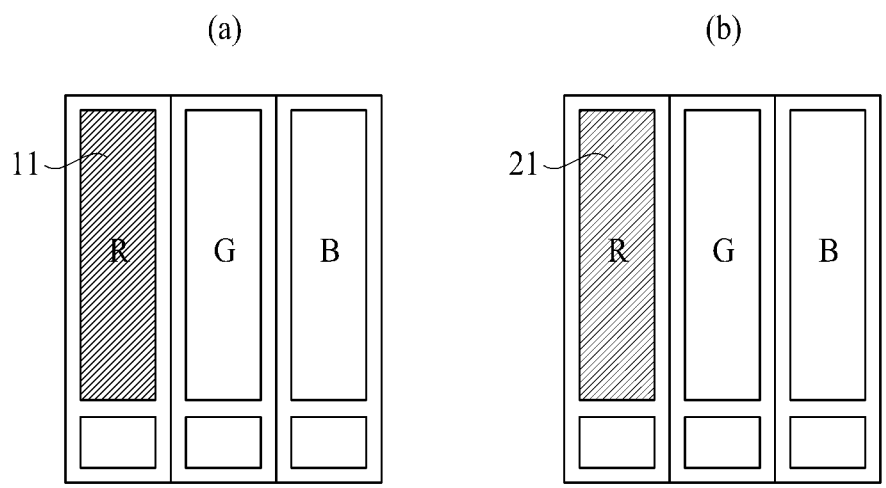
FIG. 2 is an exemplary diagram schematically illustrating a cross-sectional structure of an OLED applied to a related art organic light emitting display device.
Figure 3:
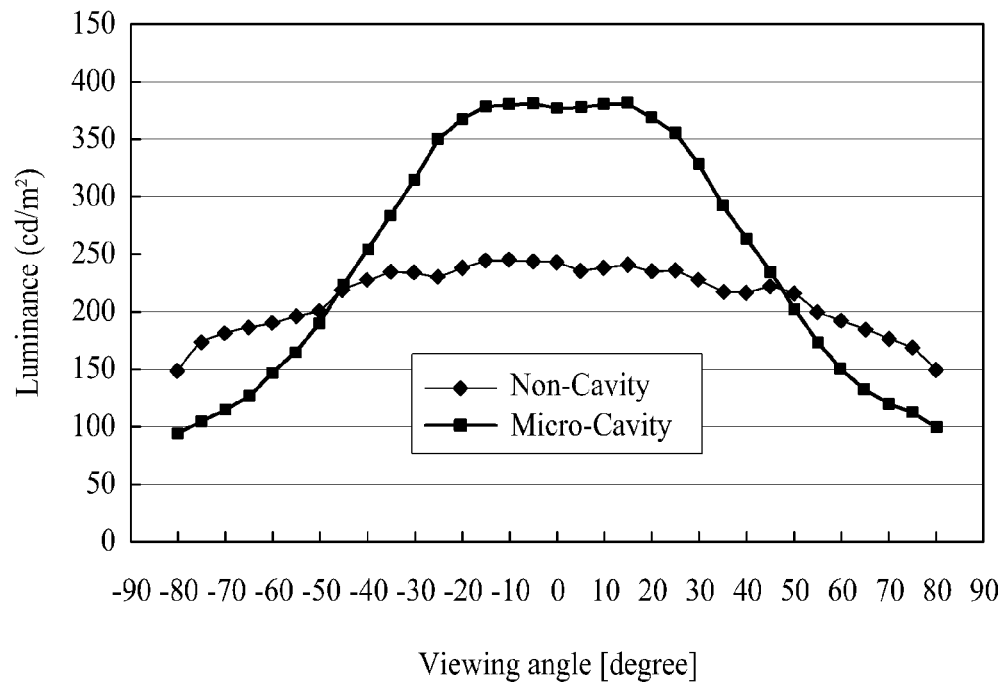
FIG. 3 is a graph showing a viewing angle characteristic of the related art organic light emitting display device.
Figure 3:
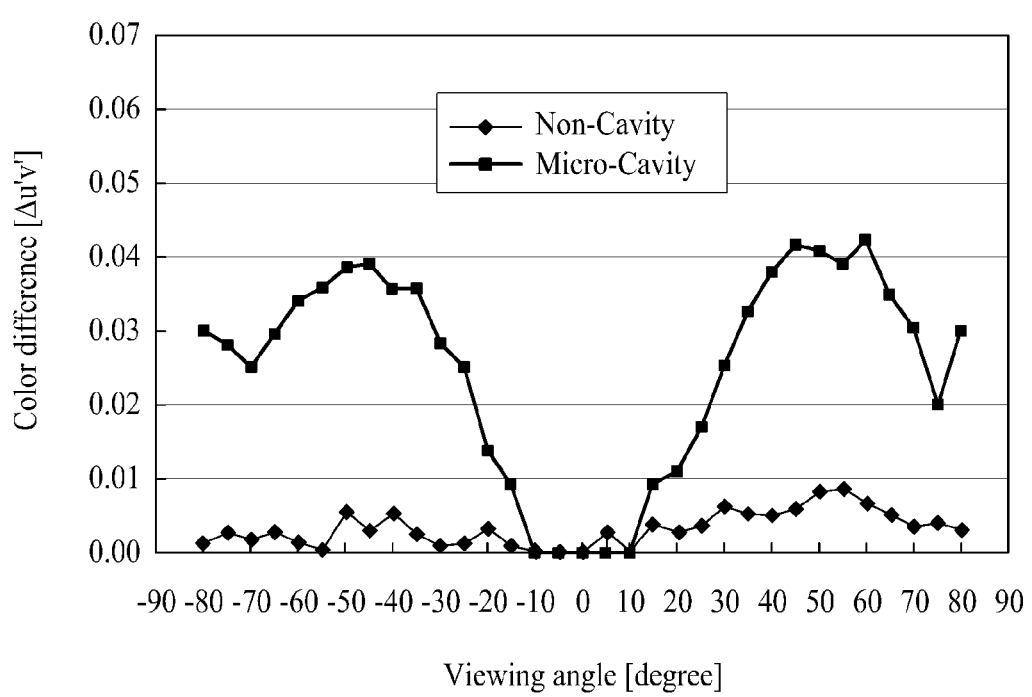

In FIG. 9, in a graph showing a viewing angle characteristic of the organic light emitting display device according to the embodiments of the present invention, a hybrid concept is illustrated. In a graph showing a viewing angle characteristic of a related art organic light emitting display device described above with reference to FIG. 3, a non-cavity is illustrated. In a graph showing a viewing angle characteristic of a related art organic light emitting display device using a micro-cavity, a micro-cavity is illustrated.

In the organic light emitting display device according to the present invention, it can be seen that as shown in FIG. 9(a), a luminance characteristic is good at all viewing angles, and as shown in FIG. 9(b), a color difference characteristic is good.

The above-described embodiments of the present invention will be briefly summarized below.

In the present invention, OLEDs of the same color which are spatially separated from each other have different structures, namely, a structure where a micro-cavity occurs and a structure where the micro-cavity does not occur. Therefore, a luminance characteristic and a color difference characteristic of the organic light emitting display device can be enhanced, and it is easy to adjust a luminance characteristic and a color difference characteristic.

To this end, in the first embodiment of the present invention, only the first OLEDs 111a having the cavity anode 118a are formed on the nth horizontal line, and only the second OLEDs 111b having the transparent anode 118b are formed on the n+1st horizontal line.

Moreover, in the second embodiment of the present invention, the first OLEDs and the second OLEDs are formed on one horizontal line.

Moreover, in the third embodiment of the present invention, the first OLED and the second OLED are formed in one sub-pixel.

That is, the cavity anode 118a formed in the first OLED is formed in an ITO/Ag/ITO type, and induces a micro-cavity. The transparent anode 118b formed in the second OLED, like an anode formed in a general OLED, is formed of only ITO, and does not induce the micro-cavity.

Figure 10:
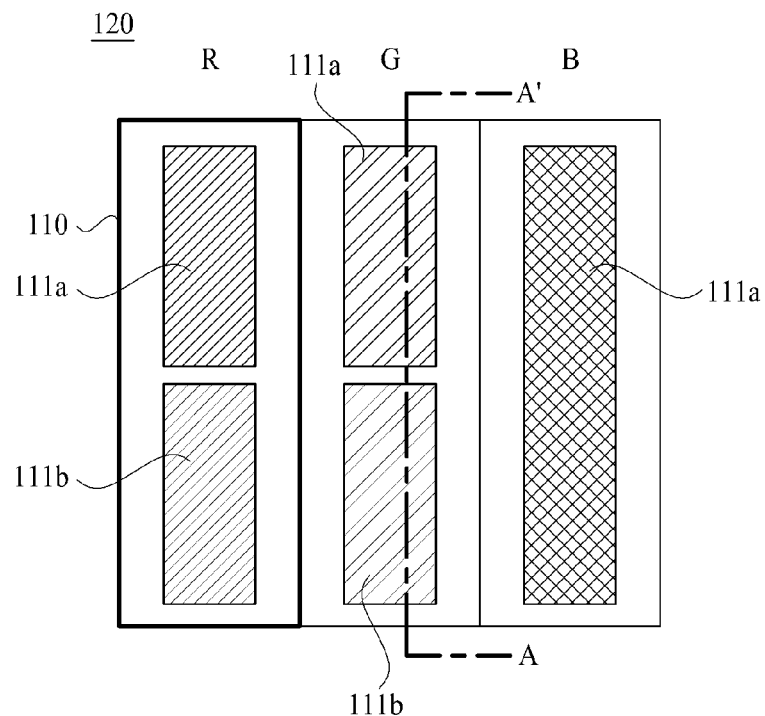
FIG. 10 is an exemplary diagram illustrating a panel applied to an organic light emitting display device according to a fourth embodiment of the present invention.
Figure 11:
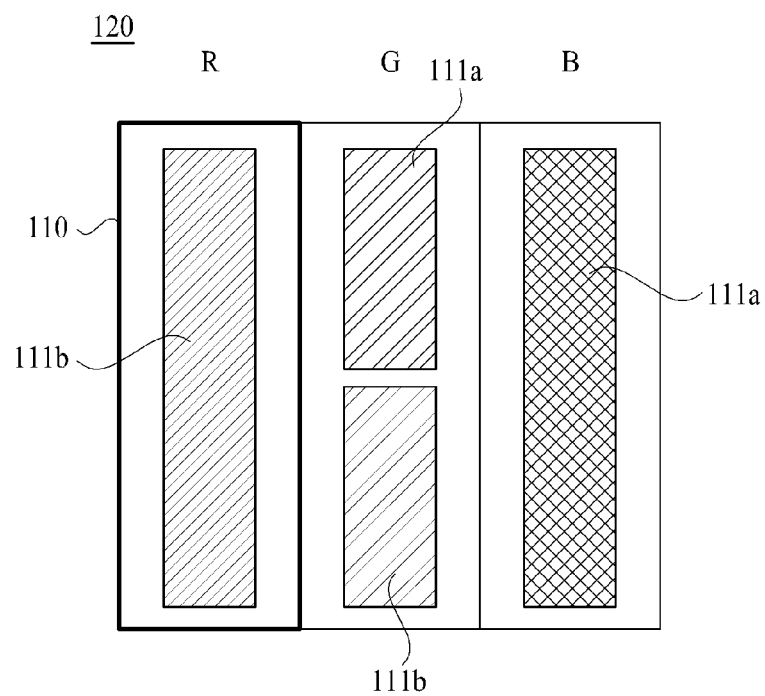
FIG. 11 is another exemplary diagram illustrating the panel applied to the organic light emitting display device according to the fourth embodiment of the present invention.
Figure 12:
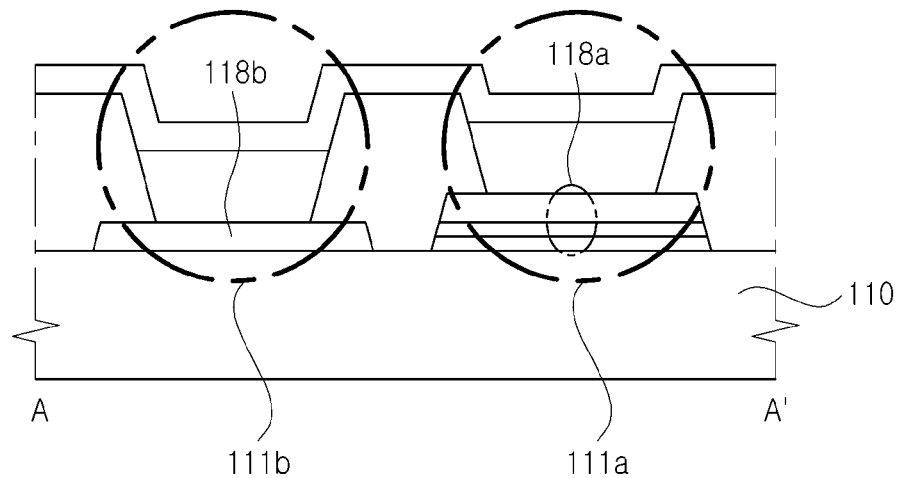
FIG. 12 is an exemplary diagram illustrating a cross-sectional surface of the panel applied to the organic light emitting display device according to the fourth embodiment of the present invention.

FIG. 10 is an exemplary diagram illustrating a panel applied to an organic light emitting display device according to a fourth embodiment of the present invention. FIG. 11 is another exemplary diagram illustrating the panel applied to the organic light emitting display device according to the fourth embodiment of the present invention. FIG. 12 is an exemplary diagram illustrating a cross-sectional surface of the panel applied to the organic light emitting display device according to the fourth embodiment of the present invention, and illustrates a cross-sectional surface taken along line A-A' of FIG. 10. In the following description, details which are the same as and similar to the above-described details are not described or will be briefly described.

In the above-described third embodiment of the present invention, each of the sub-pixels includes the first OLED 111a having the cavity anode 118a formed of a plurality of conductive materials and the second OLED 111b having the transparent anode 118b formed of one conductive material.

The fourth embodiment of the present invention is provided for enhancing a color characteristic and an image quality of a red sub-pixel, a green sub-pixel, and a blue sub-pixel by using the third embodiment of the present invention.

The organic light emitting display device according to the fourth embodiment of the present invention, as illustrated in FIGS. 4, 10 and 11, includes the panel 100 in which a plurality of the unit pixels 120 are formed and the panel driver 200, 300 and 400 that drives the panel 100. Each of the unit pixels 120 includes a plurality of sub-pixels 110.

Each of the plurality of sub-pixels applied to the fourth embodiment of the present invention may include only the second OLED 111b, include the first OLED 111a and the second OLED 111b, or include only the first OLED 111a.

A sub-pixel including only the first OLED is referred to as a first sub-pixel. The first sub-pixel is referred to as an all-cavity sub-pixel.

A sub-pixel including only the second OLED is referred to as a second sub-pixel. The second sub-pixel is referred to as a non-cavity sub-pixel.

A sub-pixel including the first OLED and the second OLED is referred to as a third sub-pixel. The third sub-pixel is referred to as a hybrid-cavity sub-pixel. In the unit pixel 120 illustrated in FIG. 10, a green sub-pixel G is the third sub-pixel. Therefore, as illustrated in FIG. 12 illustrating a cross-sectional surface of the green sub-pixel G, the green sub-pixel G illustrated in FIG. 10 includes the first OLED 111a having the cavity anode 118a formed of a plurality of conductive materials and the second OLED 111b having the transparent anode 118b formed of one conductive material.

In the fourth embodiment of the present invention, the unit pixel 120 is formed by a combination of the first sub-pixel, the second sub-pixel, and the third sub-pixel.

For example, as illustrated in FIG. 10, the unit pixel 120 applied to the fourth embodiment of the present invention may include a red sub-pixel R, a green sub-pixel G, and a blue sub-pixel B. The red sub-pixel R is the third sub-pixel, the green sub-pixel G is the third sub-pixel, and the blue sub-pixel is the first sub-pixel.

As another example, as illustrated in FIG. 11, the unit pixel 120 applied to the fourth embodiment of the present invention may include a red sub-pixel R, a green sub-pixel G, and a blue sub-pixel B. The red sub-pixel R is the second sub-pixel, the green sub-pixel G is the third sub-pixel, and the blue sub-pixel is the first sub-pixel.

In addition to the above-described two embodiments, the unit pixel 120 applied to the fourth embodiment of the present invention may be formed by variously combining a red sub-pixel R, a green sub-pixel G, and a blue sub-pixel B.

In the fourth embodiment of the present invention, as described in the third embodiment of the present invention, the first OLED and the second OLED configuring the third sub-pixel may be connected to one driver in common, and may be simultaneously driven.

Figure 13:
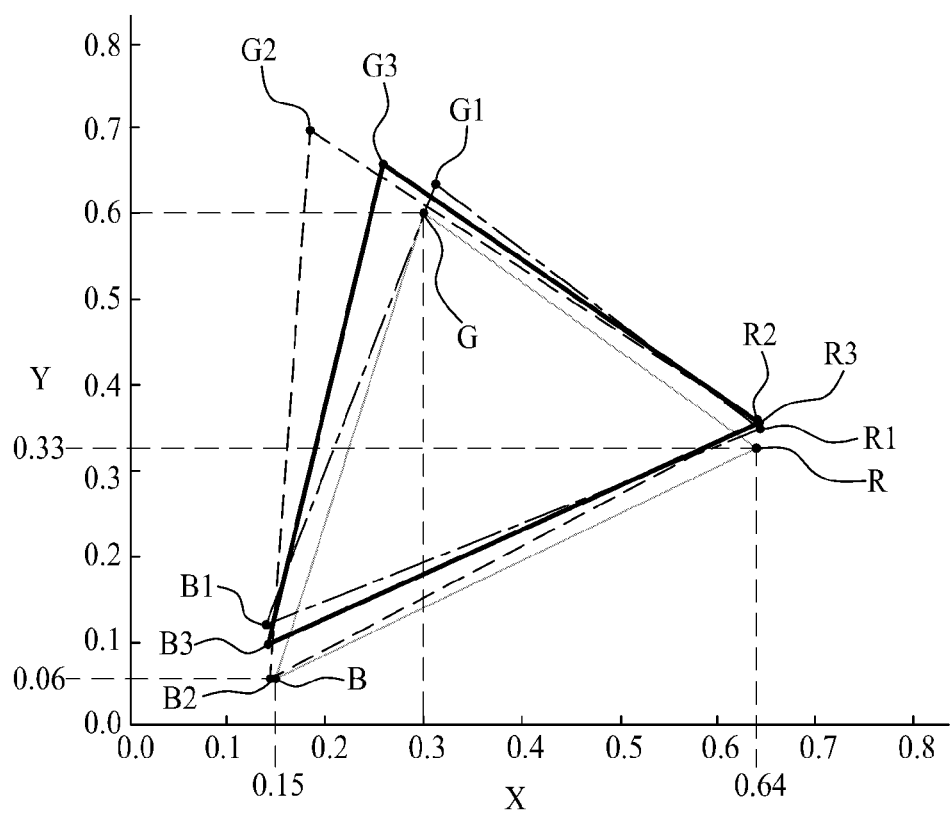
FIG. 13 is a color coordinate system for describing the principle of the organic light emitting display device according to the fourth embodiment of the present invention.
Figure 14:
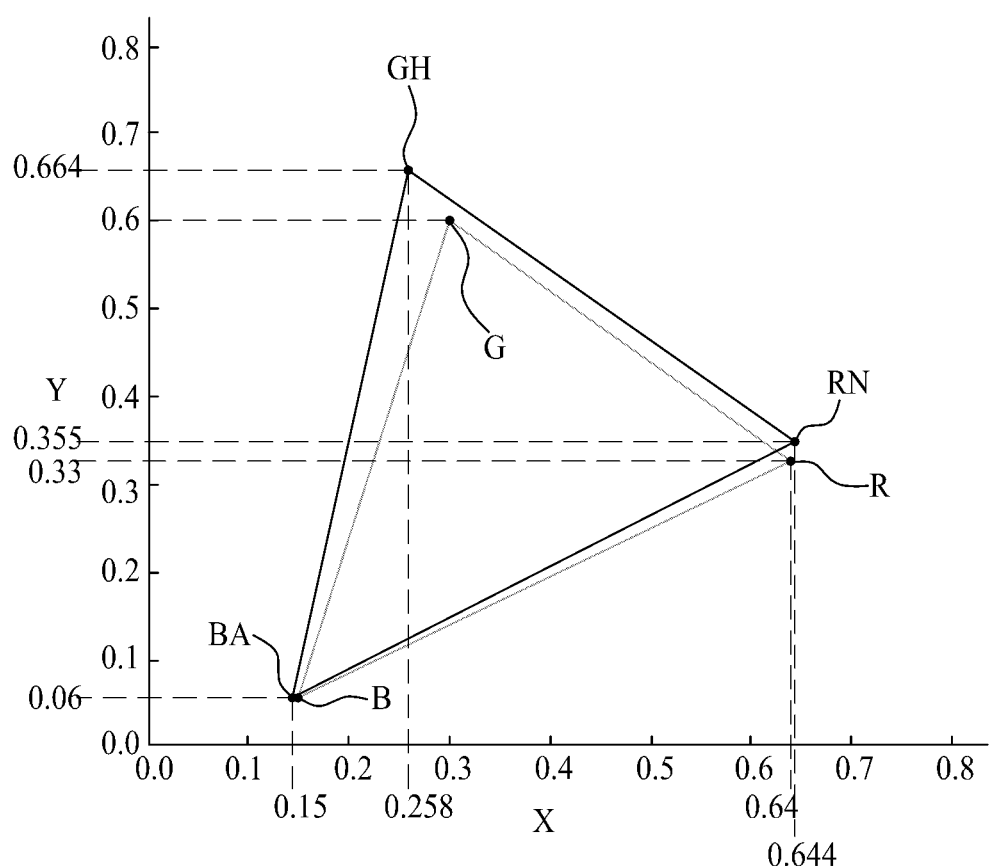
FIG. 14 is a color coordinate system of the panel applied to the organic light emitting display device according to the fourth embodiment of the present invention.

FIG. 13 is a color coordinate system for describing the principle of the organic light emitting display device according to the fourth embodiment of the present invention, and FIG. 14 is a color coordinate system of the panel applied to the organic light emitting display device according to the fourth embodiment of the present invention.

In the fourth embodiment of the present invention, a cavity structure is optimized for each of a red sub-pixel, a green sub-pixel, and a blue sub-pixel configuring the unit pixel 120, and thus, a color characteristic of each of the red sub-pixel, the green sub-pixel, and the blue sub-pixel can be enhanced. Therefore, an image quality of a display device can be improved. A structure of the cavity anode 118a formed of a plurality of conductive materials is referred to as a cavity structure.

In the fourth embodiment of the present embodiment, each of a red sub-pixel, a green sub-pixel, and a blue sub-pixel configuring the unit pixel 120 may be one selected from the first sub-pixel, the second sub-pixel, and the third sub-pixel.

For example, a color purity and a luminance efficiency of the cavity sub-pixel (the first sub-pixel) increase, but a viewing angle characteristic and a color difference characteristic are not enhanced. Therefore, when the cavity structure is applied, a sub-pixel in which a color coordinate change is small and a change in a viewing angle characteristic and a color difference characteristic is large may be formed as the hybrid-cavity sub-pixel (the third sub-pixel) or the non-cavity sub-pixel (the second sub-pixel). Therefore, the change in a viewing angle characteristic and a color difference characteristic can be reduced.

Moreover, although formed as the hybrid-cavity sub-pixel, a sub-pixel which is difficult to secure a desired color coordinate characteristic may be the all-cavity sub-pixel. In the all-cavity sub-pixel (the first sub-pixel), a desired color coordinate characteristic can be secured.

As described above, in the fourth embodiment of the present invention, a structure for realizing an optimal color characteristic is selected based on a device characteristic of each of a red OLED, a green OLED, and a blue OLED. Therefore, a red sub-pixel, a green sub-pixel, and a blue sub-pixel configuring one unit pixel may be formed in different structures.

According to the fourth embodiment of the present invention, a color coordinate characteristic, a viewing angle characteristic, and a color difference characteristic of each of a red sub-pixel, a green sub-pixel, and a blue sub-pixel are optimized, and thus, an image quality of a display device is improved.

To provide an additional description, in the third embodiment of the present invention, all sub-pixels configuring a unit pixel may be the third sub-pixels, namely, the hybrid-cavity sub-pixels. However, in the fourth embodiment of the present invention, a red sub-pixel, a green sub-pixel, and a blue sub-pixel configuring one unit pixel may be formed in different structures.

According to the fourth embodiment of the present invention, a color characteristic (for example, color coordinates, a viewing angle, and a color difference) satisfies standard which is required in a display device.

For example, one selected from a red OLED, a green OLED, and a blue OLED can fundamentally have a very bad color coordinate characteristic, and even thought the one OLED is formed in the hybrid-cavity sub-pixel, desired color coordinates cannot be satisfied. Such an OLED may be formed in the non-cavity sub-pixel or the all-cavity sub-pixel.

Moreover, when one selected from a red OLED, a green OLED, and a blue OLED is formed in the all-cavity sub-pixel, the one OLED can have a very bad viewing angle and color difference characteristic. In this case, even though the one OLED is formed in the hybrid-cavity sub-pixel, a viewing angle characteristic and a color difference characteristic cannot satisfy a desired target value. Such an OLED may be formed in the non-cavity sub-pixel.

That is, in the fourth embodiment of the present invention, a sub-pixel having a structure appropriate for each color may be formed in consideration of a color coordinate characteristic, a viewing angle characteristic, and a color difference characteristic of each of a red sub-pixel, a green sub-pixel, and a blue sub-pixel The above-described details will now be described as a detailed example.

First, in a red OLED, when the cavity structure is applied, a color coordinate change is small, and a change in a viewing angle characteristic and a color difference characteristic is large. Therefore, the red sub-pixel including the red OLED may be formed as the hybrid-cavity sub-pixel (the third sub-pixel) or the non-cavity sub-pixel (the second sub-pixel). Therefore, the change in the viewing angle characteristic and the color difference characteristic can be reduced.

Second, when a green sub-pixel including a green OLED is the hybrid-cavity sub-pixel, a desired color coordinate characteristic can be secured, and a viewing angle characteristic and a color difference characteristic can be mitigated.

Third, even when a blue sub-pixel including a blue OLED is the hybrid-cavity sub-pixel, a desired color coordinate characteristic is difficult to secure. Therefore, a blue sub-pixel may be formed as the all-cavity sub-pixel, and thus, a desired color coordinate characteristic can be secured.

Hereinafter, an optimal structure of each of a red sub-pixel, a green sub-pixel, and a blue sub-pixel is determined based on a color coordinate characteristic with reference to Table 1 and FIGS. 13 and 14.

TABLE 1

| Item | | BT709 (Spec.) | Non-cavity | All-cavity | Hybrid-cavity | Optimal Combination (R: Non-cavity G: Hybrid-cavity B: All-cavity) |
|---|---|---|---|---|---|---|
| Red | CIE_x | 0.640 | 0.644 | 0.641 | 0.643 | 0.644 |
| | CIE_y | 0.330 | 0.355 | 0.357 | 0.356 | 0.355 |
| Green | CIE_x | 0.300 | 0.312 | 0.185 | 0.258 | 0.258 |
| | CIE_y | 0.600 | 0.638 | 0.698 | 0.664 | 0.664 |
| Blue | CIE_x | 0.150 | 0.140 | 0.144 | 0.142 | 0.144 |
| | CIE_y | 0.060 | 0.124 | 0.060 | 0.099 | 0.060 |
| White | Viewing angle color difference | — | 0.007 | 0.111 | 0.034 | 0.049 |
| CG(BT709@CIE1976) | | | 72.4% | 111.9% | 86.2% | 104.2% |

FIG. 13 shows a color coordinate system. In FIG. 13, areas illustrated as R, G, and B indicate color coordinates (BT709 standard) which are required in a display device. For example, the display device may display colors included in the areas illustrated as R, G, and B in FIG. 13.

In FIG. 13, areas illustrated as R1, G1, and B1 indicate color coordinates of when a red sub-pixel, a green sub-pixel, and a blue sub-pixel are the non-cavity sub-pixels. In comparison with the areas illustrated as R, G, and B, it can be seen that the areas illustrated as R1, G1, and B1 are unfavorable to express blue. To provide an additional description, the areas illustrated as R1, G1, and B1 do not include some of blue among the areas illustrated as R, G, and B.

In FIG. 13, areas illustrated as R2, G2, and B2 indicate color coordinates of when a red sub-pixel, a green sub-pixel, and a blue sub-pixel are the all-cavity sub-pixels. In comparison with the areas illustrated as R, G, and B, it can be seen that the areas illustrated as R2, G2, and B2 are unfavorable to express red. To provide an additional description, the areas illustrated as R2, G2, and B2 do not include some of red among the areas illustrated as R, G, and B.

In FIG. 13, areas illustrated as R3, G3, and B3 indicate color coordinates of when a red sub-pixel, a green sub-pixel, and a blue sub-pixel are the hybrid-cavity sub-pixels. In comparison with the areas illustrated as R, G, and B, it can be seen that the areas illustrated as R3, G3, and B3 are unfavorable to express blue and red. To provide an additional description, the areas illustrated as R3, G3, and B3 do not include some of blue and red among the areas illustrated as R, G, and B.

Therefore, referring to FIG. 13 and Table 1, a red sub-pixel may be the non-cavity sub-pixel RN, a green sub-pixel may be the hybrid-cavity sub-pixel GH, and a blue sub-pixel may be the all-cavity sub-pixel BA.

In FIG. 14, color coordinates based on sub-pixels which are formed in the types determined based on the analysis are illustrated as RN, GH, and BA. It can be seen that areas illustrated as RN, GH, and BA include areas illustrated as R, G, and B. That is, when a red sub-pixel is the non-cavity sub-pixel RN, a green sub-pixel is the hybrid-cavity sub-pixel GH, and a blue sub-pixel is the all-cavity sub-pixel BA, it can be seen that a desired color coordinate characteristic is obtained. The unit pixel 120 which is set based on the above-described combination is illustrated in FIG. 11.

Hereinabove, a case in which a red sub-pixel, a green sub-pixel, and a blue sub-pixel configure the unit pixel has been described as an example. However, the unit pixel may be configured with sub-pixels which output different colors, in addition to the red sub-pixel, the green sub-pixel, and the blue sub-pixel. Also, the unit pixel may be configured with three or more sub-pixels.

According to the embodiments of the present invention, a front viewing angle of the organic light emitting display device can be enhanced.

Moreover, according to the embodiments of the present invention, a luminance characteristic of a color difference characteristic of the organic light emitting display device can be enhanced.

Moreover, according to the embodiments of the present invention, a desired color coordinate characteristic can be secured.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   a panel including a plurality of unit pixels, each unit pixel including red, green, and blue sub-pixels;
   a panel driver configured to drive the panel; and
   a sub-pixel driver provided in each sub-pixel,
   wherein an all-cavity sub-pixel includes a first organic light emitting diode (OLED), a non-cavity sub-pixel includes a second OLED, and a hybrid-cavity sub-pixel includes the first and second OLEDs, each sub-pixel being formed of one of the all-cavity, non-cavity, and hybrid-cavity sub-pixels,
   wherein at least one of the red, green, and blue sub-pixels configuring the unit pixel is formed of the hybrid-cavity sub-pixel to increase viewing angle and color difference characteristics,
   wherein the first OLED has a cavity anode including ITO/Ag/ITO to increase emission efficiency, and the second OLED has a transparent anode including a conductive material, and wherein the first and second OLEDs of the hybrid-cavity sub-pixel are connected in parallel to the sub-pixel driver, and are simultaneously driven by the sub-pixel driver.

2. The organic light emitting display device of claim 1, wherein:
the first OLED is provided in a bottom emission type where light is output to an outside through the cavity anode, and
the second OLED is provided in a bottom emission type where light is output to an outside through the transparent anode.

3. The organic light emitting display device of claim 1, wherein each of the red, green and blue sub-pixels of the unit pixel is formed of the hybrid-cavity sub-pixel.

4. The organic light emitting display device of claim 1, wherein:
the red sub-pixel is formed of the hybrid-cavity sub-pixel,
the green sub-pixel is formed of the hybrid-cavity sub-pixel, and
the blue sub-pixel is formed of the all-cavity sub-pixel.

5. The organic light emitting display device of claim 1, wherein:
the red sub-pixel is formed of the non-cavity sub-pixel,
the green sub-pixel is formed of the hybrid-cavity sub-pixel, and
the blue sub-pixel is formed of the all-cavity sub-pixel.

6. The organic light emitting display device of claim 1, wherein the sub-pixel driver includes a switching transistor, a driving transistor, and a capacitor.

7. The organic light emitting display device of claim 1, wherein the first OLED further includes a first cathode and a micro-cavity is occurred between the cavity anode and the first cathode.

8. The organic light emitting display device of claim 1, wherein the second OLED further includes a second cathode and a micro-cavity is not occurred between the transparent anode and the second cathode.

9. The organic light emitting display device of claim 1, wherein each unit pixel emits white light.

10. A method of forming an organic light emitting display device, the method comprising:
providing a panel including a plurality of unit pixels, each unit pixel including red, green and blue sub-pixels;
providing a panel driver configured to drive the panel; and
providing a sub-pixel driver in each sub-pixel,
wherein an all-cavity sub-pixel includes a first organic light emitting diode (OLED), a non-cavity sub-pixel includes a second OLED, and a hybrid-cavity sub-pixel includes the first and second OLEDs, each sub-pixel being formed of one of the all-cavity, non-cavity, and hybrid-cavity sub-pixels,
wherein at least one of the red, green, and blue sub-pixels configuring the unit pixel is formed of the hybrid-cavity sub-pixel to increase viewing angle and color difference characteristics,
wherein the first OLED has a cavity anode including ITO/Ag/ITO to increase emission efficiency, and the second OLED has a transparent anode including a conductive material, and
wherein the first and second OLEDs of the hybrid-cavity sub-pixel are connected in parallel to the sub-pixel driver, and are simultaneously driven by the sub-pixel driver.

* * * * *